(12) United States Patent
Yanagigawa et al.

(10) Patent No.: US 11,557,648 B2
(45) Date of Patent: Jan. 17, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventors: Hiroshi Yanagigawa, Tokyo (JP); Katsumi Eikyu, Tokyo (JP); Masami Sawada, Tokyo (JP); Akihiro Shimomura, Tokyo (JP); Kazuhisa Mori, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/115,204

(22) Filed: Dec. 8, 2020

(65) Prior Publication Data
US 2021/0217844 A1 Jul. 15, 2021

(30) Foreign Application Priority Data
Jan. 15, 2020 (JP) .............................. JP2020-004433

(51) Int. Cl.
*H01L 29/06* (2006.01)
*H01L 29/66* (2006.01)
*H01L 29/78* (2006.01)

(52) U.S. Cl.
CPC .... *H01L 29/0634* (2013.01); *H01L 29/66734* (2013.01); *H01L 29/7815* (2013.01)

(58) Field of Classification Search
CPC ............ H01L 29/0634; H01L 29/7815; H01L 29/66727; H01L 29/36; H01L 29/41766; H01L 29/0696; H01L 29/7813; H01L 29/66674–66734; H01L 29/7801–7826; H01L 29/0856–0869; H01L 29/0873–0886; H01L 29/04–045
See application file for complete search history.

(56) References Cited

U.S. PATENT DOCUMENTS

| | | | |
|---|---|---|---|
| 8,008,717 B2 | 8/2011 | Kawashima | |
| 9,209,249 B2 | 12/2015 | Kachi | |
| 2010/0032752 A1* | 2/2010 | Hozumi | ............ H01L 29/4238 438/270 |
| 2015/0349113 A1* | 12/2015 | Katoh | ................ H01L 29/0696 257/331 |
| 2021/0183995 A1* | 6/2021 | Kobayashi | .......... H01L 29/1095 |

FOREIGN PATENT DOCUMENTS

| | | |
|---|---|---|
| JP | 2010-016309 A | 1/2010 |
| JP | 2014-154596 A | 8/2014 |

* cited by examiner

*Primary Examiner* — Shahed Ahmed
(74) *Attorney, Agent, or Firm* — McDermott Will & Emery LLP

(57) ABSTRACT

In a trench gate type power MOSFET having a super-junction structure, both improvement of a breakdown voltage of a device and reduction of on-resistance are achieved. The trench gate and a column region are arranged so as to be substantially orthogonal to each other in a plan view, and a base region (channel forming region) and the column region are arranged separately in a cross-sectional view.

9 Claims, 22 Drawing Sheets

A-A' cross-sectional view of the unit cell

FIG. 08
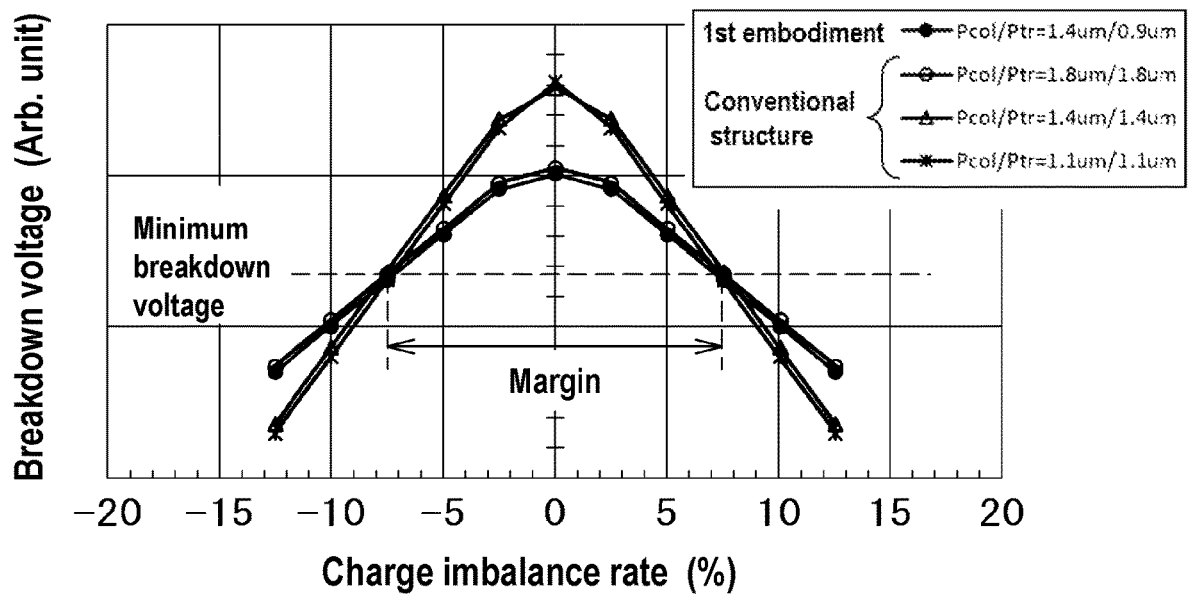
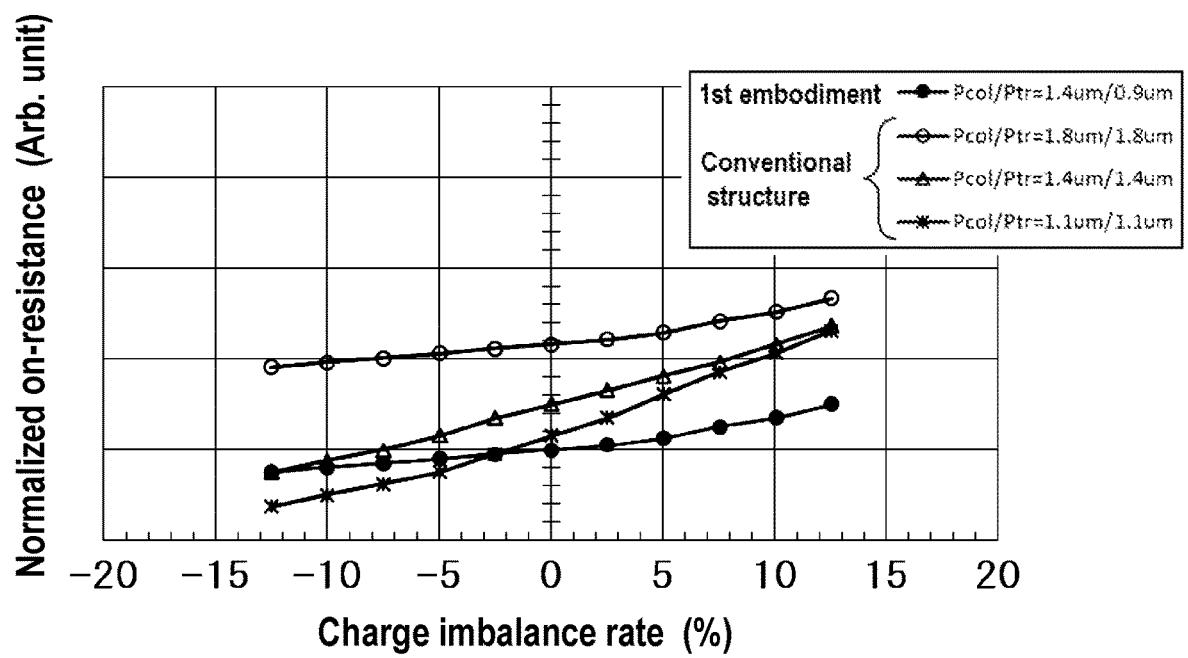

FIG. 14
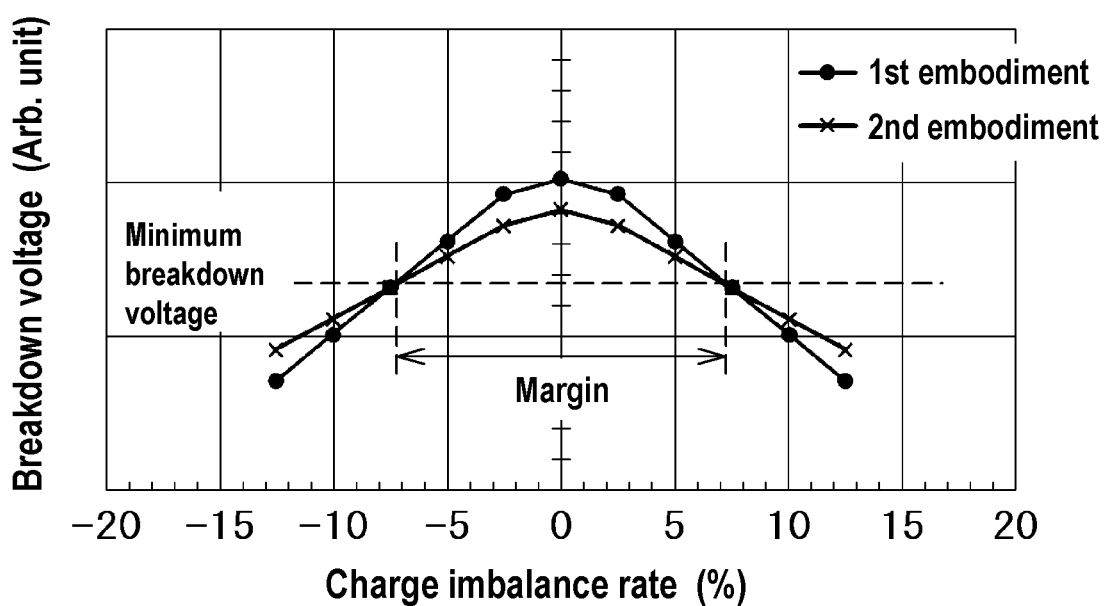
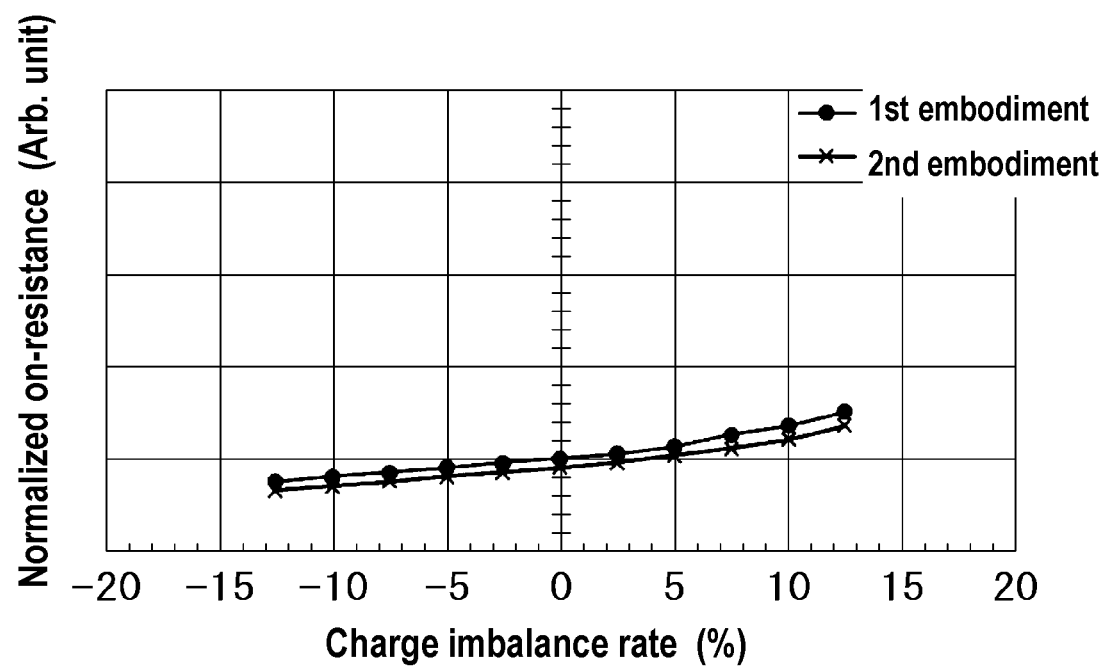

SEMICONDUCTOR DEVICE AND METHOD OF MANUFACTURING THE SAME

CROSS-REFERENCE TO RELATED APPLICATIONS

The disclosure of Japanese Patent Application No. 2020-004433 filed on Jan. 15, 2020 including the specification, drawings and abstract is incorporated herein by reference in its entirety.

BACKGROUND

Disclosed embodiments relate to a semiconductor device and a method of manufacturing the same, for example, the disclosed embodiments can be suitably applied to the semiconductor device including a power MOSFET (Metal Oxide Semiconductor Field Effect Transistor) having a super-junction structure.

In the power MOSFET, a trade-off relation between a breakdown voltage (BVdss) of a device and an on-resistance Ron•A (Rsp) standardized by a unit area is a critical factor for improving a device performance. As a solution, there are a method to reduce a channel resistance by adopting a trench gate structure and its miniaturization, and a method to adopt the super-junction structure (hereinafter, also referred to as a SJ structure) in which p/n layers are periodically formed in a drift region, and it is possible to realize an ultra-low on-resistance that is below a silicon limit. And it is also possible to combine the both.

As a background technology in this technical field, for example, there is a technology such as Japanese Patent Laid-Open No. JP-A-2010-016309 (Patent Document 1). Patent Document 1 discloses "a super-junction structured high breakdown voltage transistor in which, between two trench gates, a plurality of column regions are separated from each other along a second direction orthogonal to a first direction, and in the first direction, centers of the plurality of column regions overlap centers between the two trench gates, and the plurality of column regions are not formed below the two trench gates." (FIGS. 1 and 2 of Patent Document 1).

Further, Japanese Patent Laid-Open No. JP-A-2014-154596 (Patent Document 2) discloses a power MOSFET having a super-junction structure in which a plurality of gate electrodes are formed so as to extend in a direction orthogonal to a direction in which a trench defining an active region extends in a plan view (FIG. 38 of Patent Document 2).

SUMMARY

In the SJ structure described above, although a normalized on-resistance Ron•A (Rsp) can be reduced by narrowing a pitch and increasing a concentration of a periodically arranged p/n layers, there is a problem that variation increases due to increase in a dimensional sensitivity of the p/n layers with respect to the breakdown voltage of the device and the normalized on-resistance Ron•A (Rsp).

That is, a dimension margin of the p/n layers for securing the breakdown voltage of a certain level or more is decreased, and there is a possibility that a manufacturing yield is lowered due to increase in variation.

In the above Patent Document 1, p-layers (hereinafter, also referred to as P-columns) of the periodic p/n layers constituting the SJ structure are arranged so as to be separated from each other along a direction perpendicular to a trench gate. However, the P-column is not disposed at a bottom of a trench. As a result, an occupancy rate of the P-column in the drift region is lowered to reduce the on-resistance.

However, in a design method of Patent Document 1, when trying to further reduce the on-resistance, it is necessary to reduce a pitch of the trench and the periodic p/n layers and increase a concentration. and there is a problem that the breakdown voltage and a sensitivity of the on-resistance become high due to a dimensional variation of the p/n layers.

Further, in Patent Document 2, a column region (n-type diffusion region NR and p-type diffusion region PR) and a base region (channel region PCH) is connected, a threshold voltage VT for turning on a power MOSFET varies with a presence or absence of the column region, there is a problem of lack of stability.

Other objects and novel features will become apparent from the description of this specification and the accompanying drawings.

According to embodiments of the present disclosure, in a trench gate type power MOSFET having a super-junction structure, arranged so as to substantially perpendicular to a trench gate and the column region in a plan view, and arranged to separate a base region (channel forming region) and the column region in a cross-sectional view.

According to the embodiments of the present disclosure, in the trench gate type power MOSFET having the super-junction structure, gate density per unit cell can be improved without narrowing the pitch of the periodic p/n layers. And It is possible to reduce the on-resistance, suppress the breakdown voltage and suppress the sensitivity of the on-resistance in the dimensional variation of the p/n layers.

It is possible to improve the breakdown voltage of the device and reduce the on-resistance.

BRIEF DESCRIPTION OF THE DRAWINGS

FIG. 8 is a diagram showing an effect according to the first embodiment.

FIG. 14 is a diagram showing an effect according to the second embodiment.

DETAILED DESCRIPTION

Figure 1:
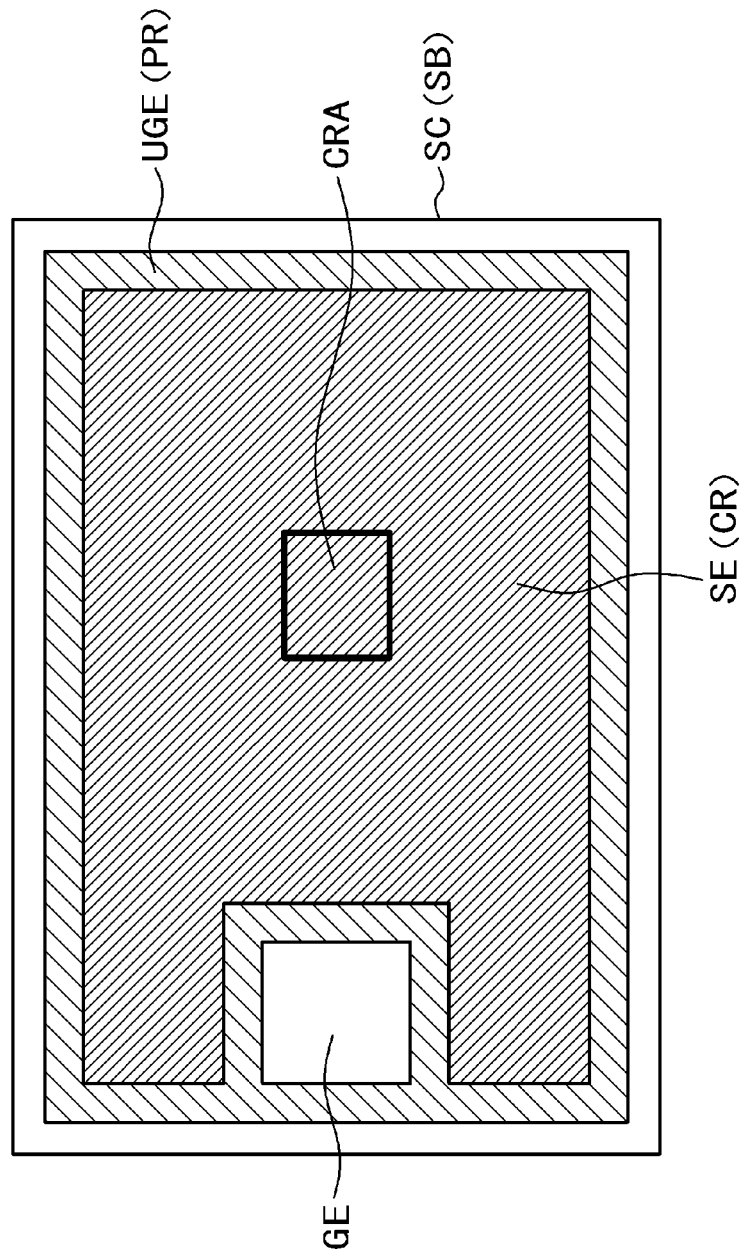
FIG. 1 is a plan view showing a configuration of a semiconductor device according to a first embodiment.

Hereinafter, Embodiments will be described with reference to drawings. In the drawings, the same components are denoted by the same reference numerals, and detailed descriptions of the same components are omitted.

First Embodiment

Figure 3:
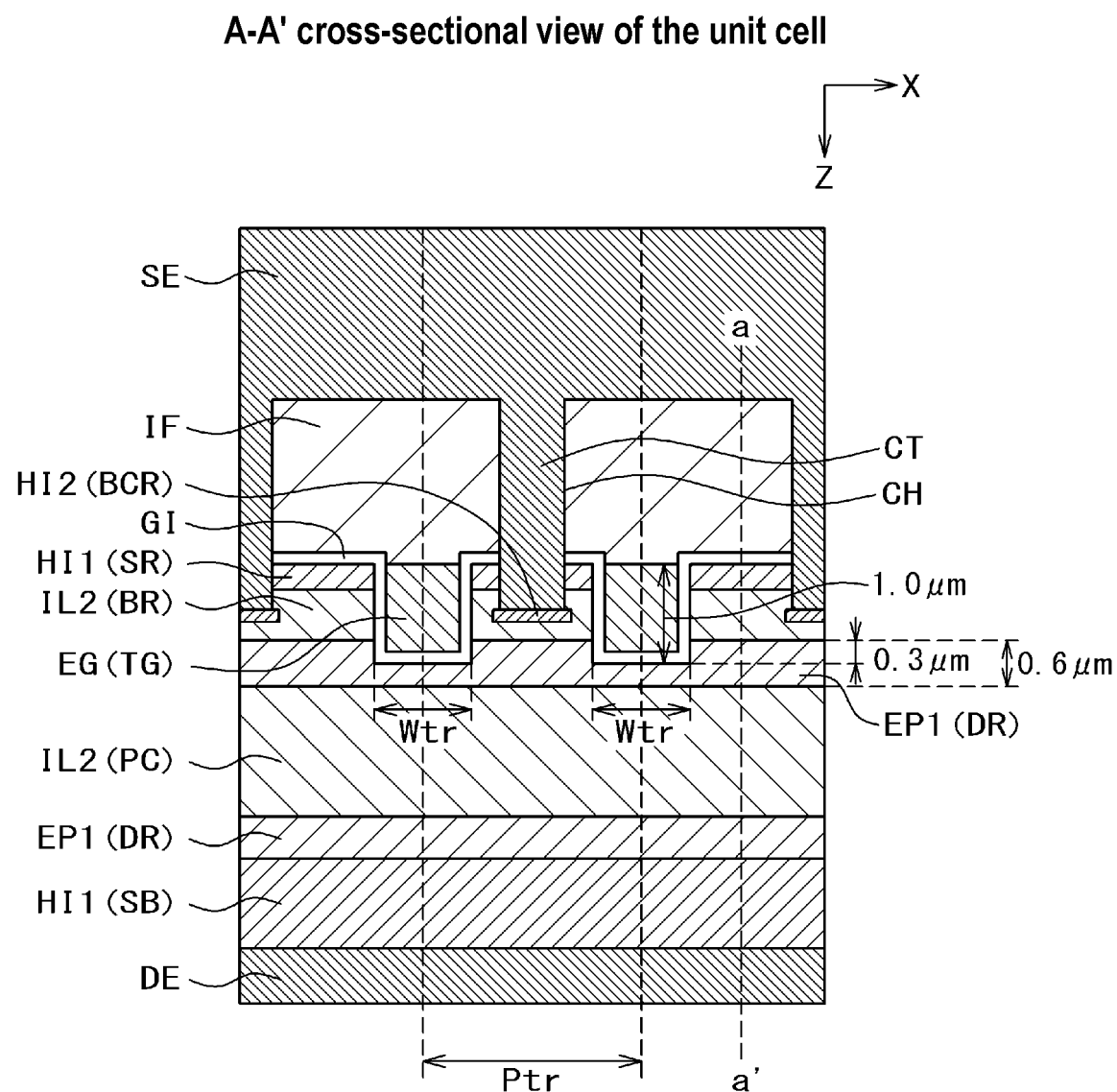
FIG. 3 is A-A' cross-sectional view of FIG. 2.
Figure 4:
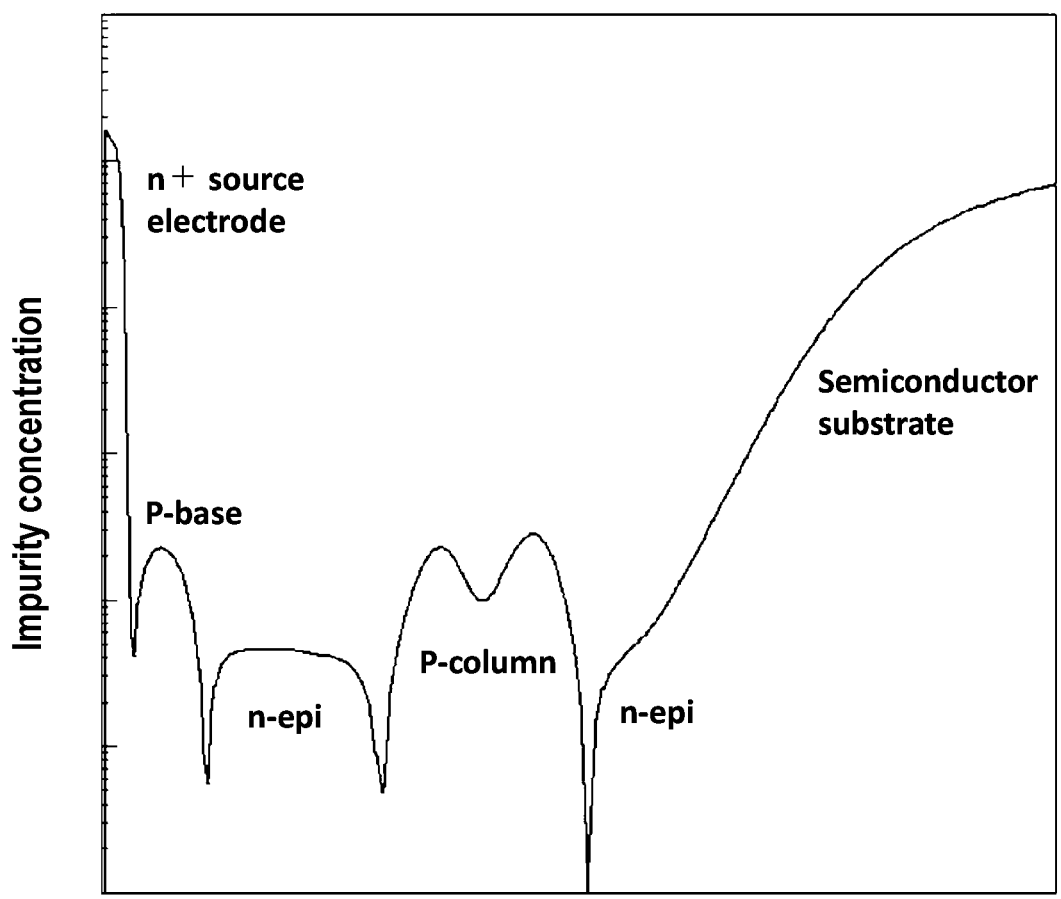
FIG. 4 is a diagram showing a a-a' cross-sectional impurity concentration profile of FIG. 3.
Figure 5:
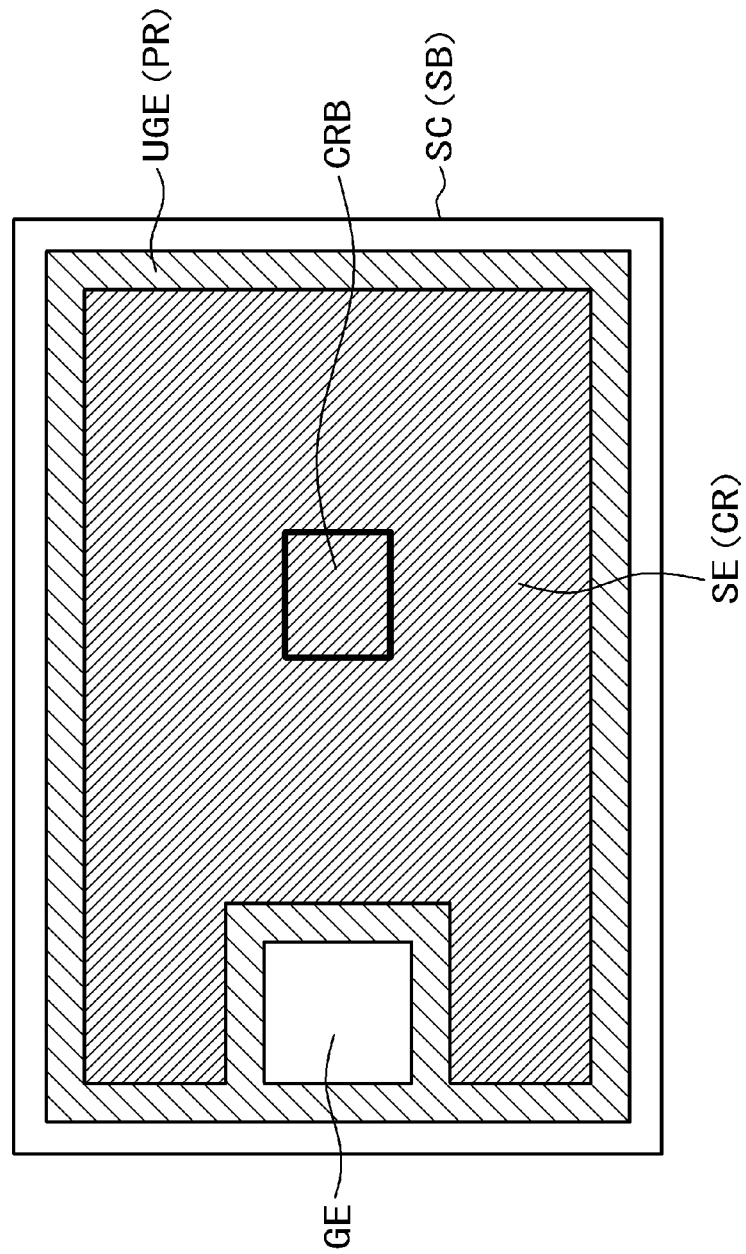
FIG. 5 is a plan view showing a configuration of a conventional semiconductor device.
Figure 6:
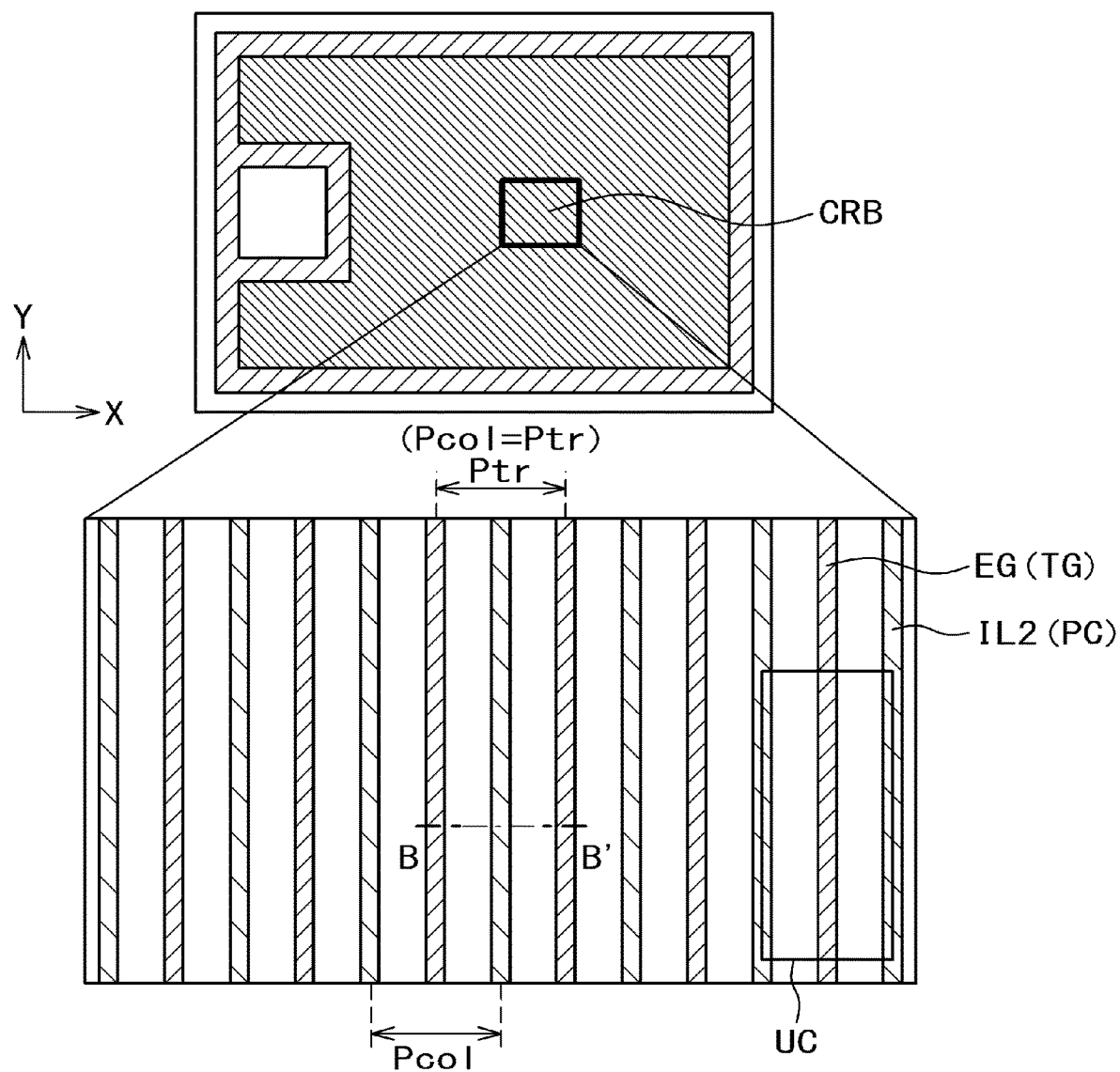
FIG. 6 is a plan enlarged view showing the layout of the trench and the column region in a cell region CRB of FIG. 5.
Figure 7:
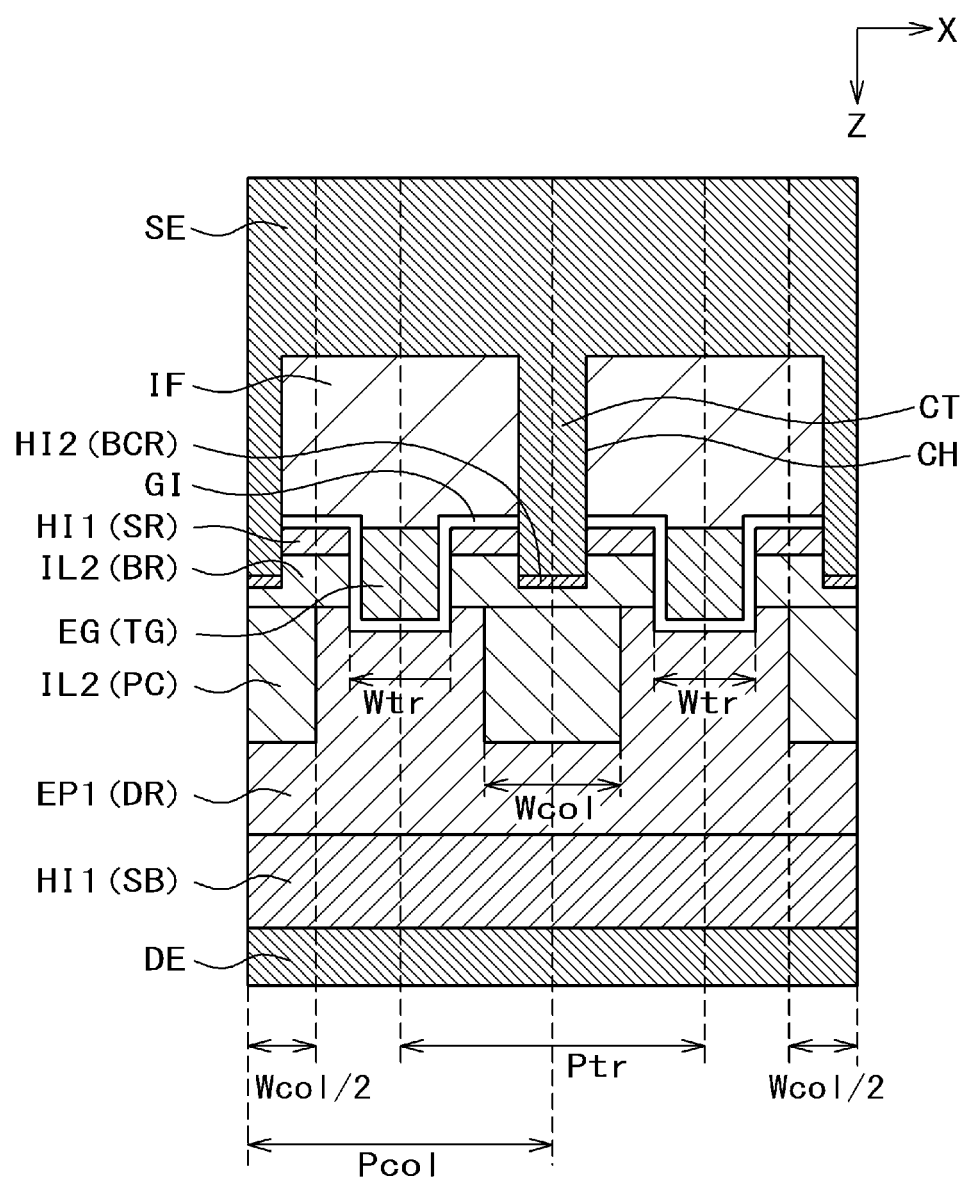
FIG. 7 is B-B' cross-sectional view of FIG. 6.

Referring to FIGS. 1 to 9, the semiconductor device of the first embodiment will be described. FIGS. 5 to 7 are configurations of the conventional semiconductor device shown as comparative example in order to make a configuration of the first embodiment easy to understand.

First, the conventional semiconductor device will be described with reference to FIGS. 5 to 7. FIG. 5 is a plan view showing a configuration of the conventional semiconductor device. The conventional semiconductor device is a transistor such as a power MOSFET and has the SJ structure. The cell region CRB and a peripheral region PR are formed on a semiconductor substrate SB having a drain electrode (not shown in FIG. 5) on a bottom surface, and a upper surface has an upper gate electrode UGE, a gate electrode GE, and a n+ source electrode SE.

FIG. 6 is a plan enlarged view showing the layout of the trench and the column region in the cell region CRB of FIG. 5. In the cell region CRB, both the trench gate TG and the P-column PC are arranged at regular intervals along Y direction, respectively. Also, a center of the P-column PC overlaps with a center between two adjacent trench gates TG, the trench gate TG and P-column PC are arranged alternately. A repetition intervals (arrangement pitch) of the P-column PC and the trench gate TG are constant intervals of Pcol and Ptr, respectively, and Pcol and Ptr are arranged at equal intervals (Pcol=Ptr). Therefore, the trench gate TG and the P-column PC has a parallel positional relationship without intersecting each other.

FIG. 7 is B-B' cross-sectional view of FIG. 6, showing a cross-sectional construction of a unit cell UC. As shown in FIG. 7, The conventional semiconductor device has an epitaxial layer EP1 of a first conductivity type (n-type) to be the drift region DR on the semiconductor substrate SB is a high-concentration impurity layer HI1 of the first conductivity type (n-type), The drain electrode DE is provided on the bottom surface of the semiconductor substrate SB.

On the epitaxial layer EP1 of the first conductivity type (n-type), an impurity layer IL2 of a second conductivity type (p-type) which is the P-column PC, the high-concentration impurity layer HI1 of the first conductivity type (n-type) which is the impurity layer IL2 and a n+ source region SR of the second conductivity type (p-type) which is a P-base region BR are provided in order from a lower layer. Incidentally, P-column PC is formed between the two trench gates TG adjacent to each other and not formed below the two trench gates TG.

As described above, the repetition intervals of the P-column PC (arrangement pitch) Pcol and the repetition intervals of the trench gate TG (arrangement pitch) Ptr are arranged at equal intervals (Pcol=Ptr). Therefore, these never intersect each other.

Here, if a cell pitch is reduced while keeping the P-column configuration having a same pitch as the arrangement pitch Ptr of the trench gate TG, it is necessary to reduce a P-column opening size in order to ensure the normalized on-resistance Ron•A (Rsp) performance, accompanied by P-column high concentration, an opening size margin for ensuring a constant or more breakdown voltage is reduced. That is, breakdown voltage changes with respect to the opening size variation is increased.

In addition, although the normalized on-resistance Ron•A (Rsp) can be reduced by increasing a channel density by decreasing the arrangement pitch Ptr of the trench gate TG, the normalized on-resistance Ron•A (Rsp) cannot be sufficiently reduced because the arrangement pitch Pcol of the P-column PC cannot be optimized independently when variation in the breakdown voltage (BVdss) of the device is considered.

Further, since an ease of an on-current flow is changed depending on a position of the P-column PC with respect to the trench gate TG, a threshold value (VT) characteristic is varied by an alignment deviation.

Next, a configuration of the semiconductor device of the first embodiment for solving these problems will be described with reference to FIGS. 1 to 4.

FIG. 1 is a plan view showing the configuration of the semiconductor device according to the first embodiment. The semiconductor device of the first embodiment is a transistor such as the power MOSFET and has the SJ structure. The cell region CRA and a peripheral region PR are formed on a semiconductor substrate SB having a drain electrode (not shown in FIG. 1) on its bottom surface, and a upper surface has an upper gate electrode UGE, a gate electrode GE, and a n+ source electrode SE.

Figure 2:
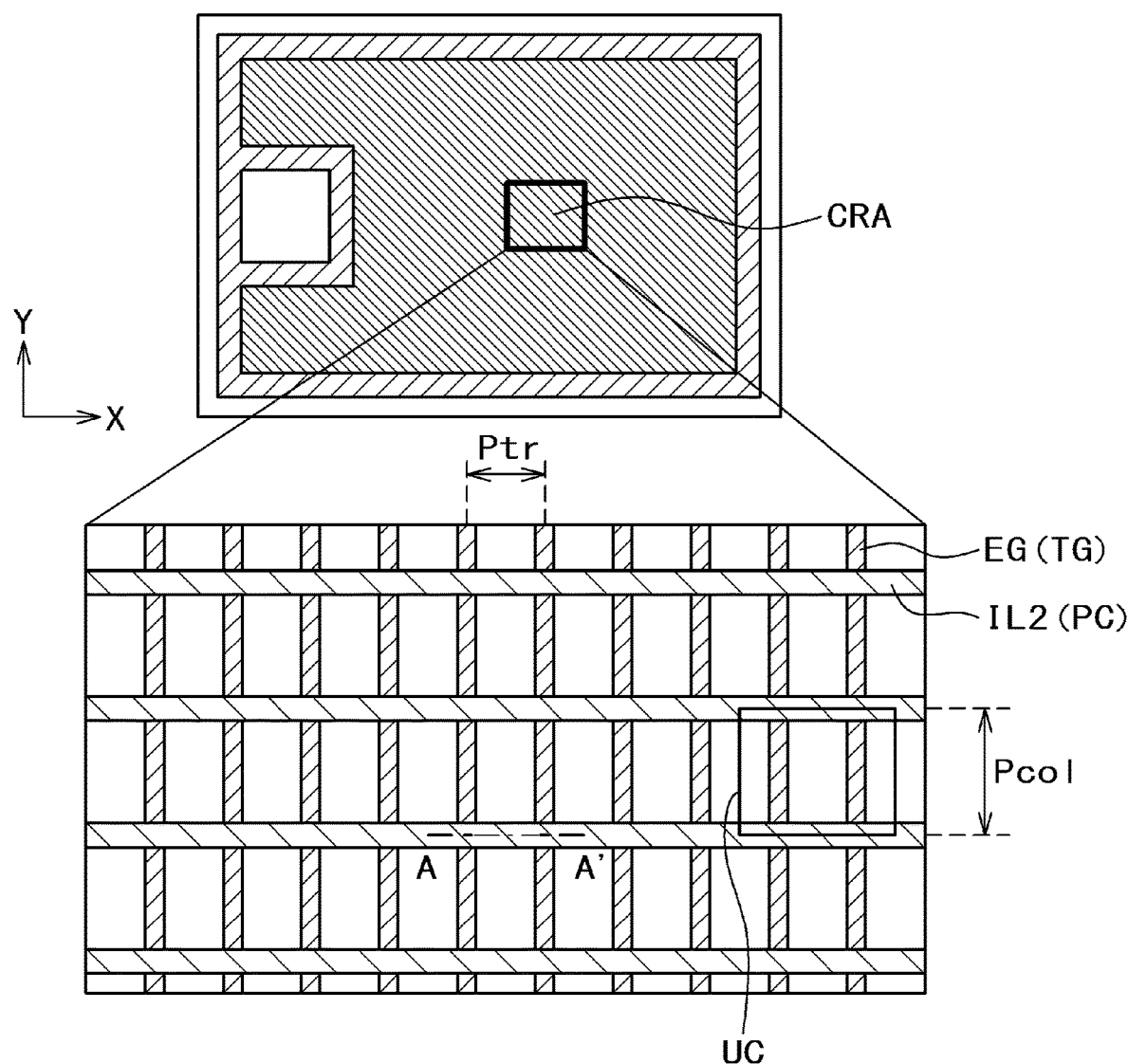
FIG. 2 is a plan enlarged view showing a layout of the trench and the column region in a cell region CRA of FIG. 1.

FIG. 2 is a plan enlarged view showing a layout of the trench and the column region in the cell region CRA of FIG. 1. In the cell region CRA, the trench gate TG along Y direction is arranged at regular intervals, P-column PC along X direction is arranged at regular intervals. Therefore, the trench gate TG and the P-column PC are arranged at an angle of approximately 90° so as to be substantially perpendicular to each other. The repetition intervals of the P-column PC and the trench gate TG are constant intervals of Pcol and Ptr, respectively.

Here, the trench gate TG, as described later in FIG. 3, an embedded gate electrodes EG formed by embedding an electrode material such as polysilicon (Poly-Si) via a gate oxide film GI in the trench formed on the upper surface of the semiconductor substrate SB. The P-column PC is formed by implanting p-type impurities such as boron (B) and gallium (Ga) in the semiconductor substrate SB by ion implantation, and then activating the p-type impurities by heat treatment.

FIG. 3 is A-A' cross-sectional view of FIG. 2, showing the cross-sectional construction of the unit cell UC. As shown in FIG. 3, the semiconductor device of the first embodiment has an epitaxial layer EP1 of the first conductivity type (n-type) to be the drift region DR on the semiconductor substrate SB is a high-concentration impurity layer HI1 of the first conductivity type (n-type), the drain electrode DE is provided on the bottom surface of the semiconductor substrate SB.

On the epitaxial layer EP1 of the first conductivity type (n-type), an impurity layer IL2 of the second conductivity type (p-type) which is the P-column PC, the epitaxial layer EP1 of the first conductivity type (n-type) which is the drift region DR, the impurity layer IL2 of the second conductivity type (p-type) which is the P-base region BR and the high-concentration impurity layer HI1 of the first conductivity type (n-type) which is the n+ source region SR are provided in order from a lower layer.

Here, the n+ source region SR is formed shallower than the P-base region BR (on the upper surface side of the semiconductor substrate SB), and the P-column PC is formed deeper than the P-base region BR (on the bottom surface side of the semiconductor substrate SB). Further, it has the embedded gate electrodes EG (trench gate TG) at regular intervals, and the interface between the epitaxial layer EP1 of the first conductivity type (n-type) (drift-region DR) has the gate oxide film GI.

An insulating film layer IF is formed on the embedded gate electrodes EG and the gate oxide film GI, and the n+ source electrode SE is formed on the insulating film layer IF. The n+ source electrode SE is formed deeper than the n+ source region SR via a striped contact hole CH (contact CT) between the trench gates TG and shallower than an interface between the P-base region BR and the drift region DR.

In addition, in order to reduce an contact resistance of an n+ source electrode SE, the n+ source electrode SE have a high-concentration impurity layer HI2 of the second conductivity type (p-type) which is a base contact region BCR. The P-base region BR is formed shallower approximately 0.3 μm than the trench gate TG including the gate oxide film GI. And the P-column PC is separated from the P-base region BR by the drift region DR with a space of approximately 0.6 μm.

The drift region DR, which is a separation layer of the P-column PC and the P-base region BR, is located around a lower portion of the trench gate TG. A thickness of the drift region DR is approximately 0.6 μm as described above.

FIG. 4 is a diagram showing a a-a' cross-sectional impurity concentration profile of FIG. 3. In FIG. 4, a vertical axis shows an impurity concentration, and a horizontal axis shows a depth from the upper surface of the semiconductor substrate. From a left side to a right side of the horizontal axis, a transition of the impurity concentration from the n+ source electrode SE to the drain electrode DE is shown. As described above, the drift region DR made of the epitaxial layer EP1 of the first conductivity type (n-type) is formed between the P-base region BR and the P-column PC (n-epi). It can be seen that the P-base region BR and the P-column PC are separated by the drift region DR (n-epi).

Note that, as shown in FIG. 4, in the first embodiment, the P-column PC is formed by providing a concentration distribution so that two concentration peaks appear.

By configuring like the first embodiment, compared with the conventional structure in which the P-column PC is always arranged between the trench gates TG adjacent to each other shown in FIGS. 5 to 7, even when the repetition intervals (arrangement pitch) Ptr of the trench gate TG is reduced to improve the channel density, the repetition intervals (arrangement pitch) Pcol of the P-column PC can be optimized independently, so that the impurity concentration can be adjusted and the normalized on-resistance Ron•A (Rsp) can be reduced without a need for excessively high concentrations.

Next, an effects of the first embodiment will be described with reference to FIGS. 8 and 9. FIG. 8 shows a relationship between a charge imbalance rate (balance of charge amounts of a p/n column) and the breakdown voltage (BVdss) and the normalized on-resistance Ron•A (Rsp) when the charge amounts of the p/n column is equal (Qp=Qn) when a highest breakdown voltage of the semiconductor device is obtained.

In the conventional structure shown in FIGS. 5 to 7, in order to reduce the normalized on-resistance Ron•A (Rsp) while maintaining a charge imbalance margin satisfying a certain breakdown voltage or more, it is necessary to reduce Pcol/Ptr and increase a concentration of the p/n column. Therefore, there is a problem that the breakdown voltage and a sensitivity of the normalized on-resistance Ron•A (Rsp) with respect to a charge-in balance rate become high.

On the other hand, a construction of the first embodiment can greatly reduce the normalized on-resistance Ron•A (Rsp) without increasing the sensitivity of the breakdown voltage and the normalized on-resistance Ron•A (Rsp) to the charge-in balance rate. Therefore, not only a basic performance is improved, but also a manufacturing variation is improved, it is possible to contribute to a yield improvement of the semiconductor device.

Although the threshold value (VT) for turning on the power MOSFET is dominated by a concentration of the P-base region BR and a thickness of the gate oxide film GI, by separating the P-base region BR and the P-column PC, it is possible to prevent the P-column PC from interfering with the concentration of the P-base region BR, thereby improving a stability of the threshold value (VT).

Figure 9:
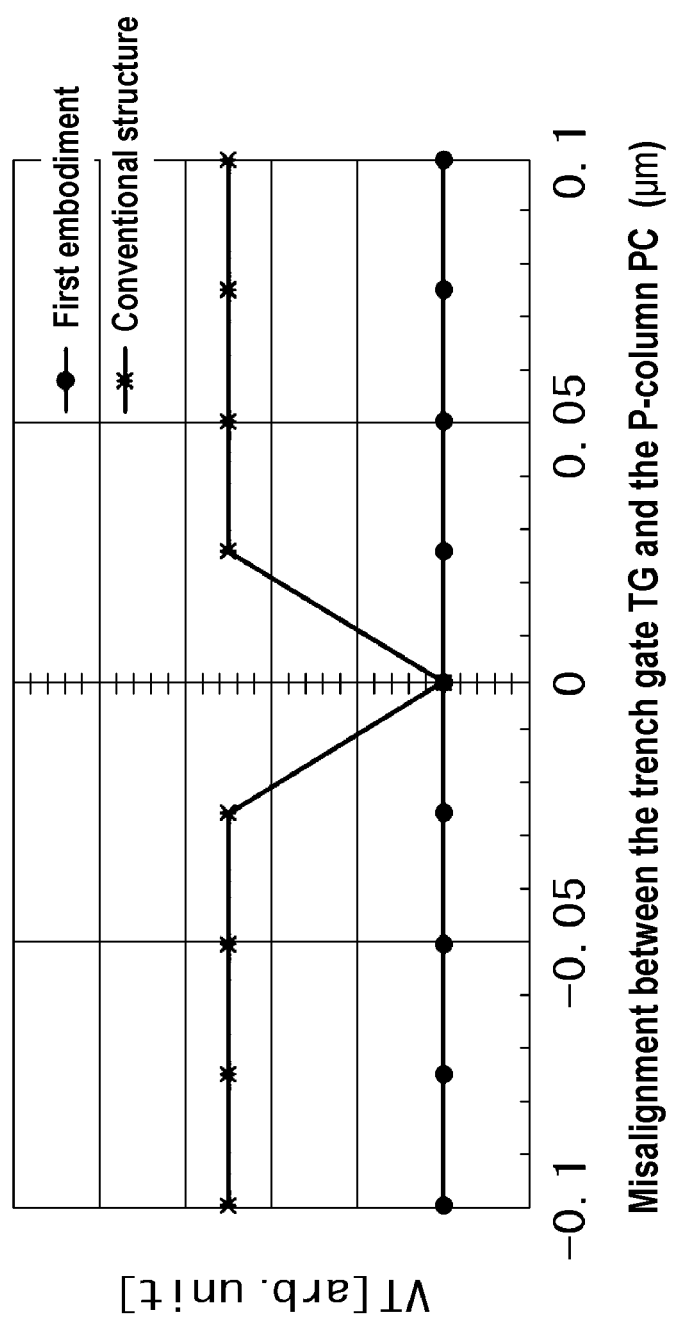
FIG. 9 is a diagram showing an effect according to the first embodiment.

FIG. 9 shows an effect of misalignment between the trench gate TG and the P-column PC on the threshold value (VT) characteristics. In the conventional structure, the current becomes difficult to flow when a distance between the trench gate TG and the P-column PC becomes close due to misalignment, and the threshold value (VT) characteristic is determined only by half of a whole of a far channel. For example, when the misalignment is 0.05 μm, the threshold value (VT) increases by approximately 50 mV.

On the other hand, in the construction of the first embodiment, since it is not affected by the misalignment, the manufacturing variation can be improved and the manufacturing yield can be improved.

Second Embodiment

Figure 10:
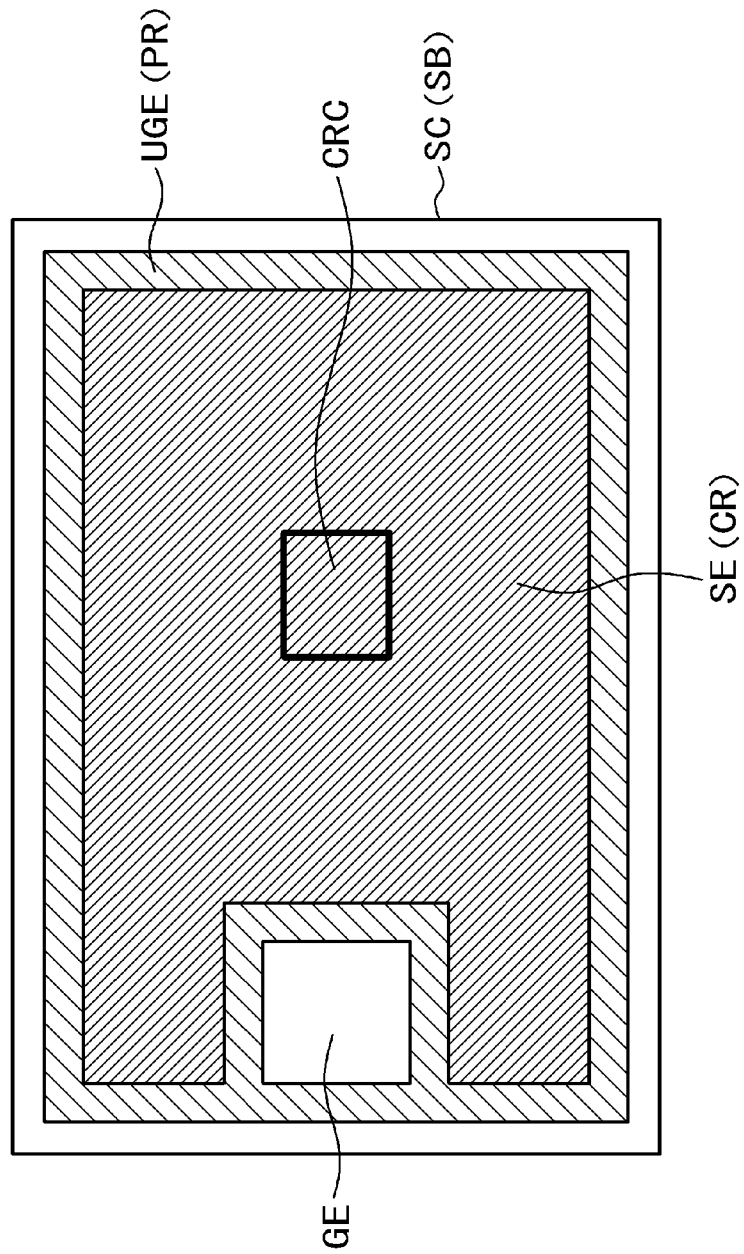
FIG. 10 is a plan view showing a configuration of the semiconductor device according to a second embodiment.

Referring to FIGS. 10 to 14, a semiconductor device of the second embodiment will be described. FIG. 10 is a plan view showing a configuration of the semiconductor device according to the second embodiment. The cell region CRC of FIG. 10 corresponds to the cell region CRA of FIG. 1, and a basic configuration is the same as that of FIG. 1.

Figure 11:
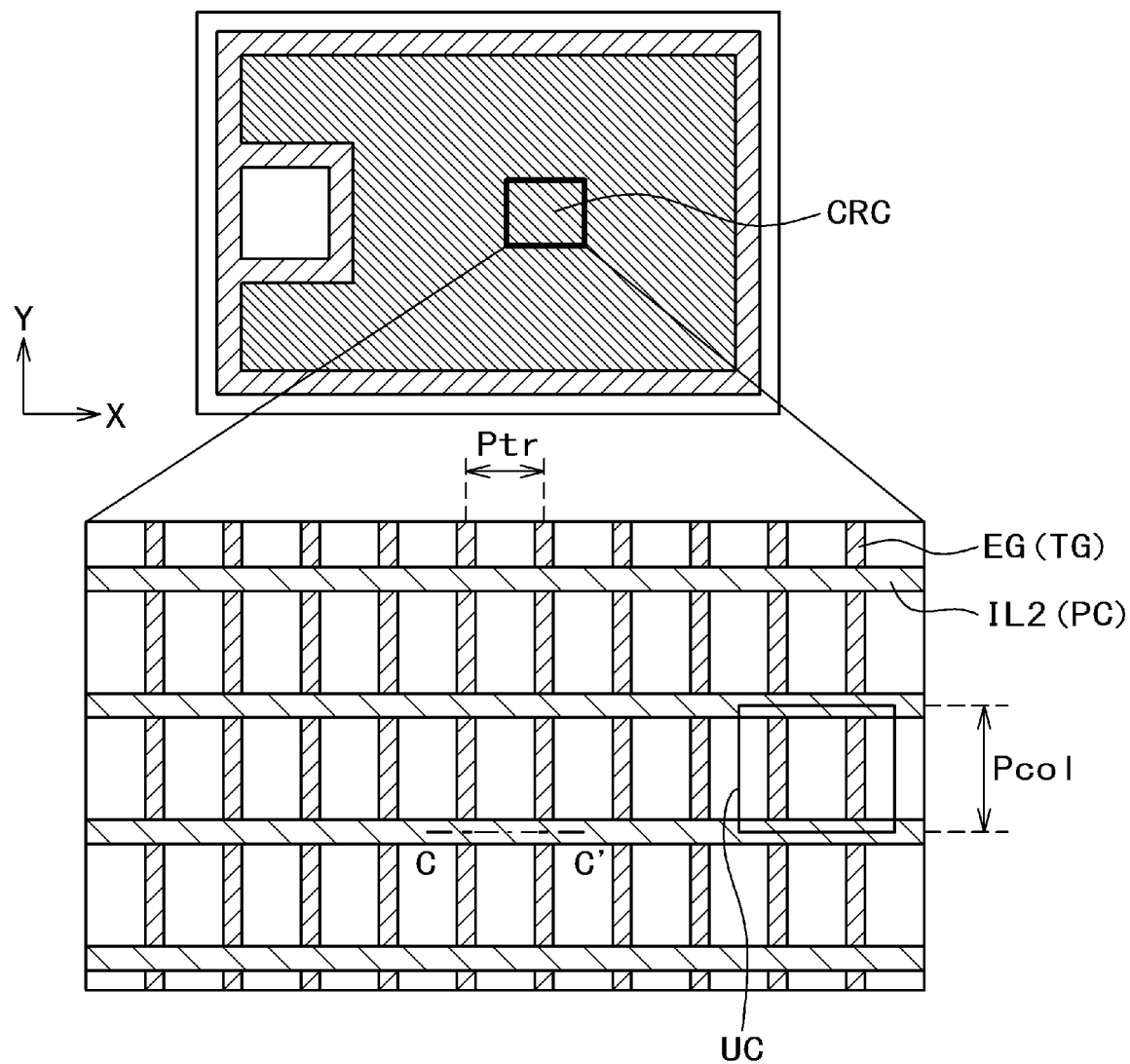
FIG. 11 is a plan enlarged view showing the layout of the trench and the column region in a cell region CRC of FIG. 10.
Figure 12:
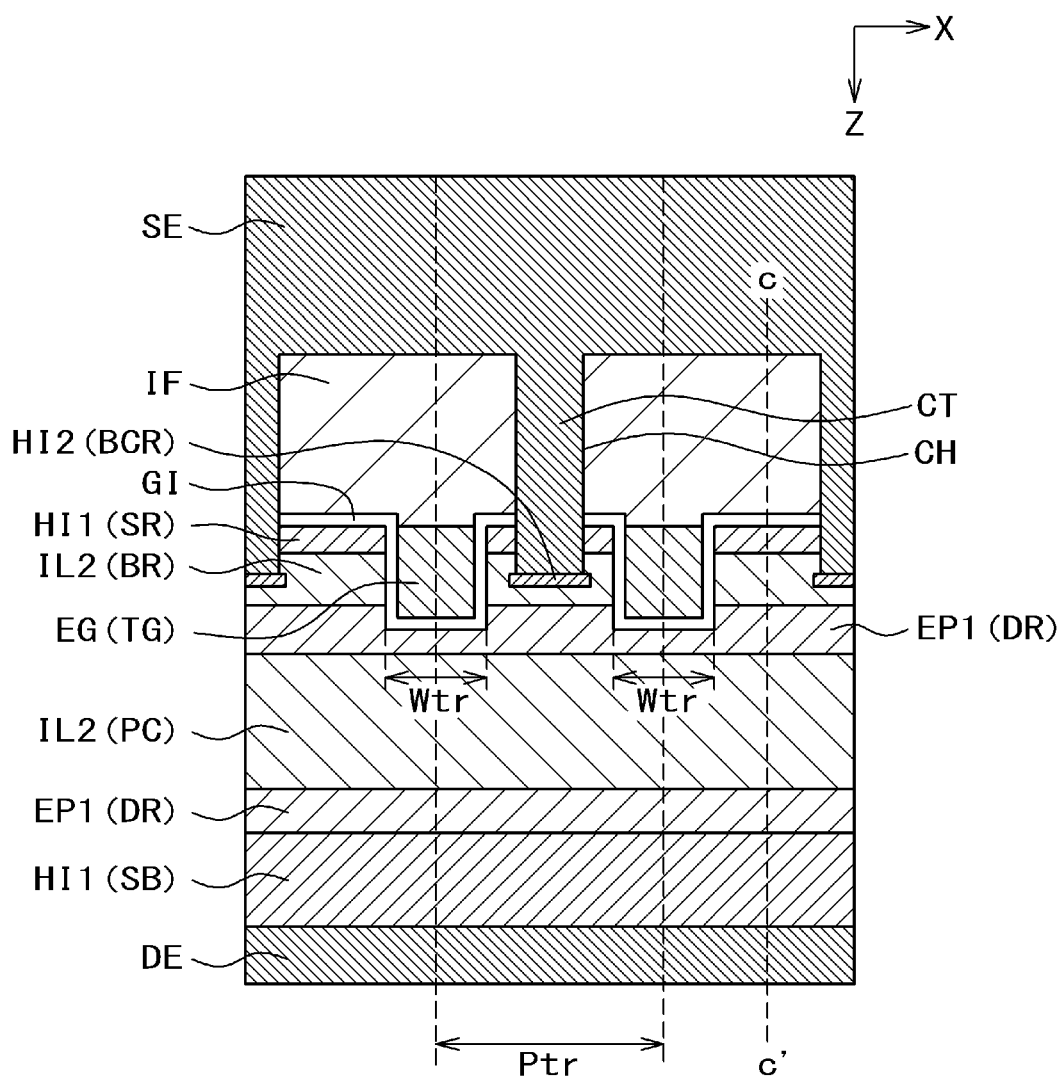
FIG. 12 is C-C' cross-sectional view of FIG. 11.

FIG. 11 is a plan enlarged view showing the layout of the trench and the column region in a cell region CRC of FIG. 10, and a basic configuration of the cell region CRC is the same as that of FIG. 2 of the first embodiment. FIG. 12 is a C-C' cross-sectional view of FIG. 11, and a basic configuration is the same as that of FIG. 3 of the first embodiment.

Figure 13:
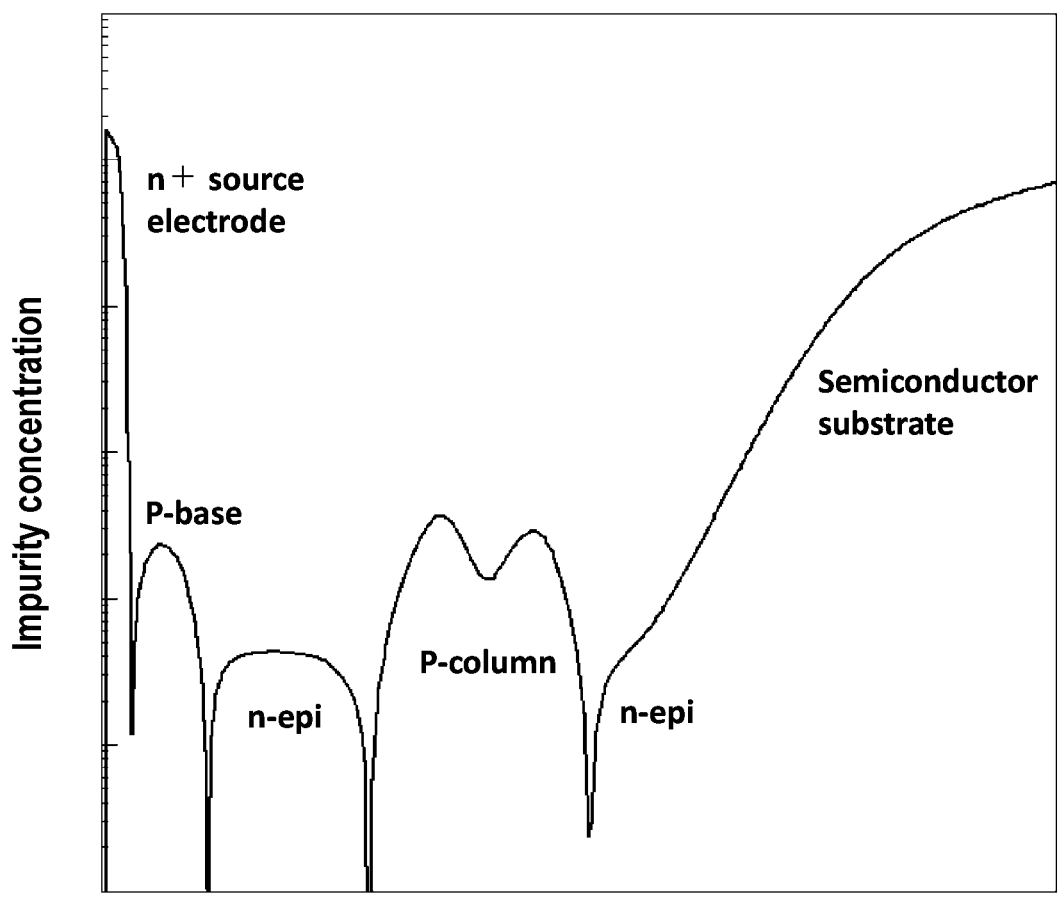
FIG. 13 is a diagram showing a c-c' cross-sectional impurity concentration profile of FIG. 12.

FIG. 13 shows c-c' cross-sectional impurity density profile of FIG. 12. In the second embodiment, similar to the first embodiment (FIG. 4), the drift region DR made of the epitaxial layer EP1 of the first conductivity type (n-type) is formed between the P-base region BR and the P-column PC (n-epi), the P-base region BR and the P-column PC are separated by the drift region DR (n-epi), additionally, further as shown in FIG. 13, the P-column PC is formed such that of the two concentration peaks of the P-column PC, a concentration peak in a shallow region from the upper surface of the semiconductor substrate is about 20% higher than a concentration peak in a deep region.

An effect of the second embodiment are shown in FIG. 14. Compared to the first embodiment, a column width dependence of the breakdown voltage becomes small, a minimum breakdown voltage can be obtained even if a maximum breakdown voltage is lowered, and the thickness of the drift region DR composed of the epitaxial layer EP1 (n-epi) of the first conductivity type (n-type) can be thinned. Therefore, the normalized on-resistance Ron•A (Rsp) can be further reduced.

Third Embodiment

Figure 15:
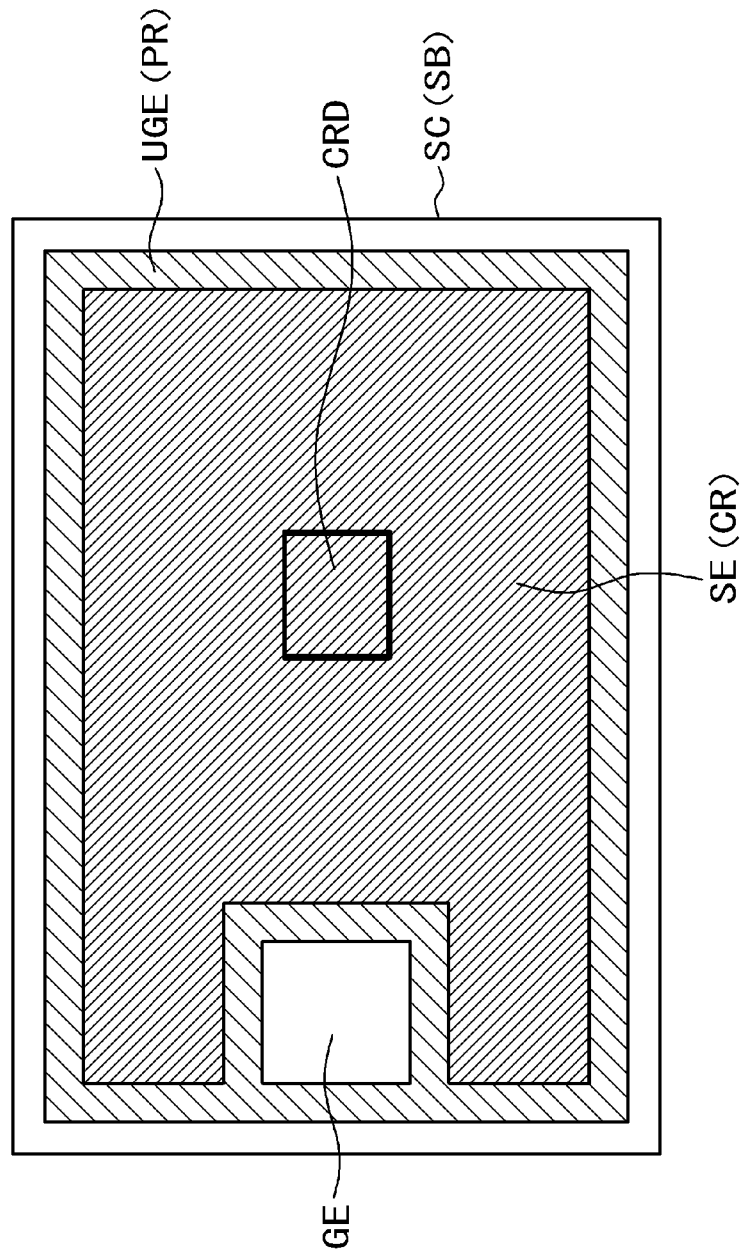
FIG. 15 is a plan view showing a configuration of a semiconductor device according to a third embodiment.
Figure 16:
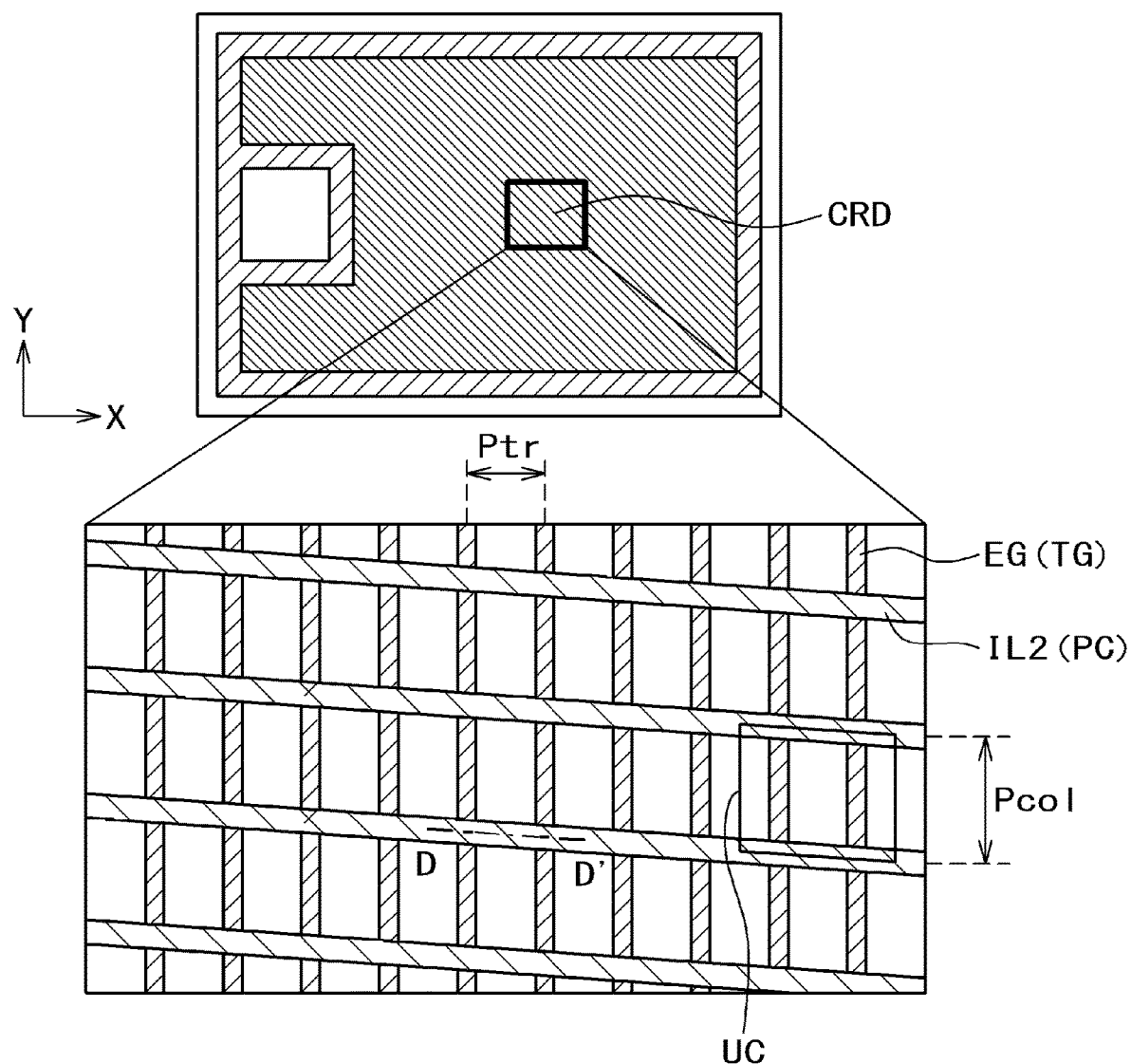
FIG. 16 is a plan enlarged view showing the layout of the trench and the column region in a cell region CRD of FIG. 15.
Figure 17:
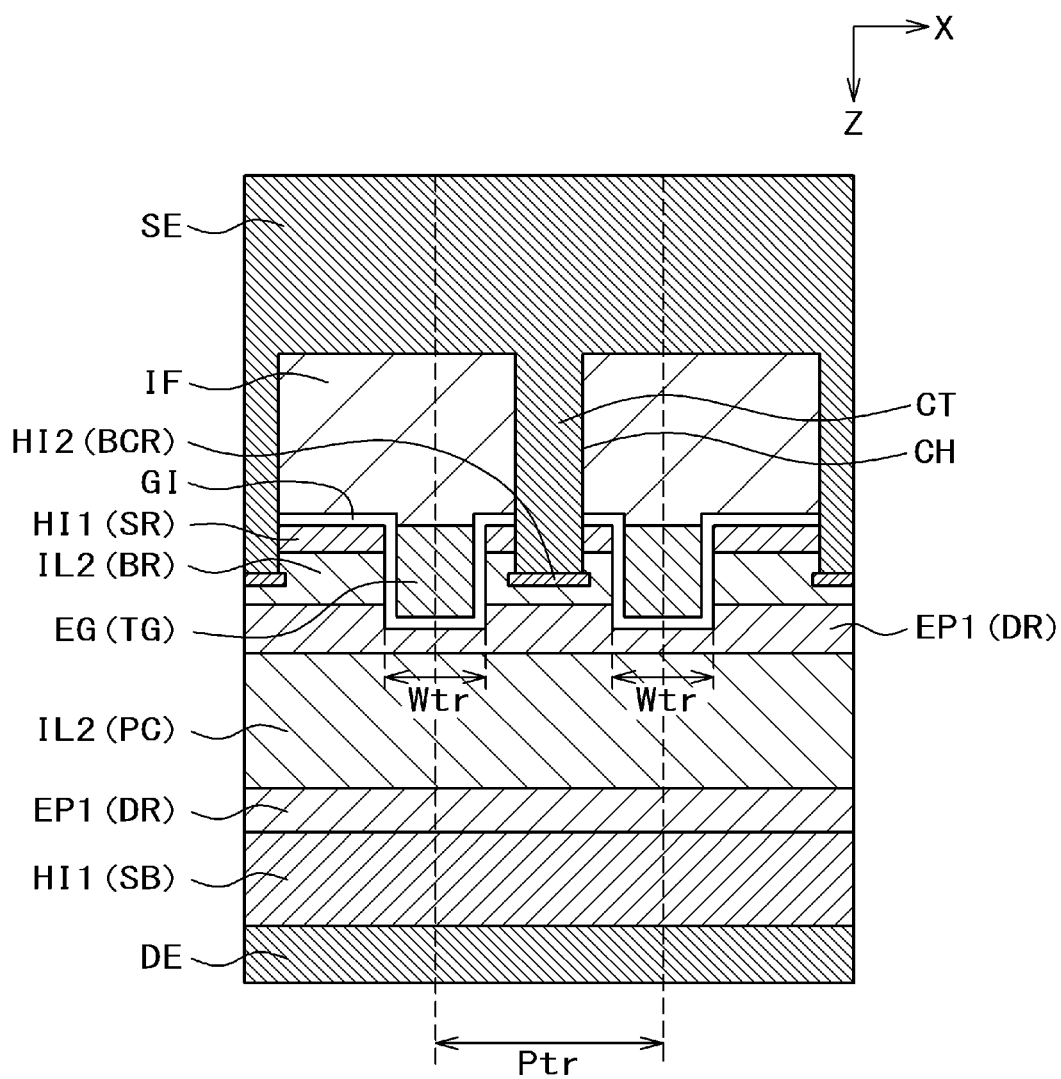
FIG. 17 is D-D' cross-sectional view of FIG. 16.

Referring to FIGS. 15 to 17, a semiconductor device of the third embodiment will be described. FIG. 15 is a plan view showing a configuration of the semiconductor device according to the third embodiment. The cell region CRD of FIG. 15 corresponds to the cell region CRA of FIG. 1, and a basic configuration is the same as that of FIG. 1.

FIG. 16 is an enlarged plan view of the cell region CRD of FIG. 15. In the third embodiment, trench gate TG is arranged at regular intervals (arrangement pitch) Ptr in Y direction in the same manner as in the first embodiment (FIG. 2), and P-column PC is arranged at constant intervals (arrangement pitch) Pcol in X direction. However, in the first embodiment (FIG. 2), the trench gate TG and the P-column PC is arranged so as to be substantially perpendicular to each other at an angle of 90°, in the third embodiment (FIG. 16), an angle formed between the trench gate TG and the P-column PC is different in that not necessarily 90° (orthogonal). That is, the trench gate TG and the P-column PC of the third embodiment (FIG. 16) are arranged so as to intersect each other at an angle not 90° (orthogonal).

With the configuration shown in the third embodiment, in the manufacturing process of the semiconductor device (power MOSFET), a margin against a rotational error during alignment of the trench gate TG and the P-column PC is expanded, thereby improving workability and improving the manufacturing yield.

Forth Embodiment

Figure 18:
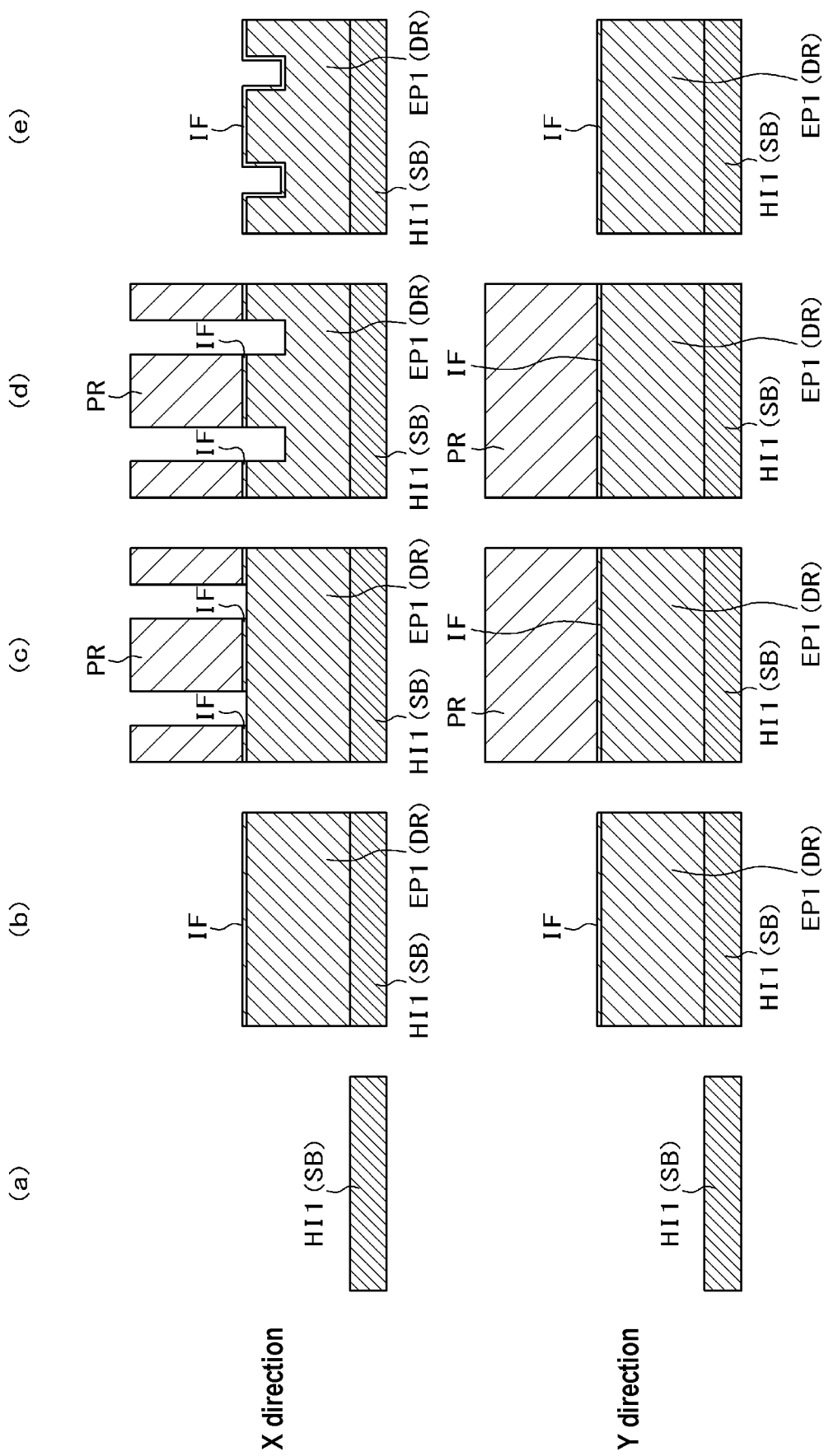
FIG. 18 is a cross-sectional view showing a manufacturing process of the semiconductor device according to the first embodiment.

Referring to FIGS. 18-22, a manufacturing method of the semiconductor device shown in the first embodiment (FIGS. 1-4) will be described. FIG. 18 is a cross-sectional views showing the manufacturing process from step (a) to (e) step of the semiconductor device in the process order, shows a cross section in X direction of FIG. 2 in the upper row, shows the cross section in Y direction of FIG. 2 in the lower row. FIGS. 19 to 22 also show cross-sectional views in the manufacturing process in the same order.

First, in a step (a), as the semiconductor substrate SB, a substrate is prepared in which (100) plane of the first conductivity type (n-type) high-concentration impurity layer HI1 made of, for example, silicon (Si) or the like is used as the upper surface.

Next, in a step (b), to form the epitaxial layer EP1 and the insulating film layer IF of the first conductivity type (n-type) as the drift region DR on the semiconductor substrate SB.

Next, in a step (c), after coating a photoresist PR to be as a mask on the insulating film layer IF, to form a trench gate pattern using the photoresist PR by photolithography technique (photolithography). Thereafter, dry etching is performed using the photoresist PR as the mask to remove the insulating film layer IF in a trench gate forming portion.

Next, in a step (d), anisotropic dry etching is performed using the photoresist PR and the patterned insulating film layer IF (hard mask) as a mask to form the trench in the trench gate forming portion of the first conductivity type (n-type) epitaxial layer EP1.

Next, in a step (e), after removing the photoresist PR and the insulating film layer IF by ashing and wet etching, forming the insulating film layer IF on the first conductivity type (n-type) epitaxial layer EP1 including the trench by thermal oxidation.

Figure 19:
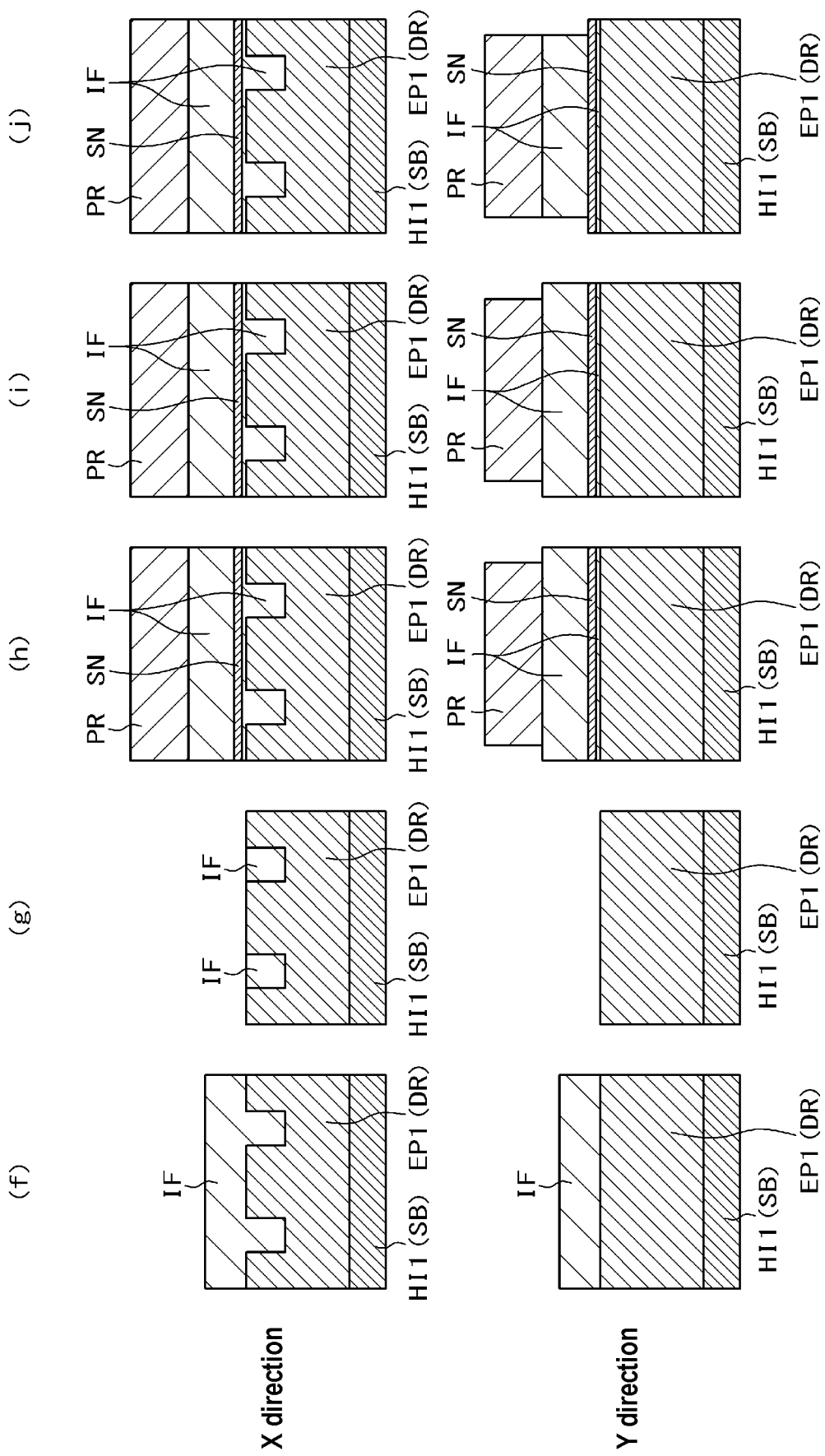
FIG. 19 is a cross-sectional view showing the manufacturing process of the semiconductor device following FIG. 18.

Next, in a step (f) of FIG. 19, another insulating film layer IF is further formed on the insulating film layer IF by CVD (Chemical Vapor Deposition) method so as to fill the trench.

Next, in a step (g), a planarization process is performed by CMP (Chemical Mechanical Polishing), and the insulating film layer IF on the first conductivity type (n-type) epitaxial layer EP1 is removed while leaving the insulating film layer IF in the trench.

Next, in a step (h) and (i), after forming the insulating film layer IF on the insulating film layer IF and the first conductivity type (n-type) epitaxial layer EP1 in the trench by heat treatment, a silicon nitride film (Si3N4 film) SN is further formed by CVD method, further, an insulating film layer IF is deposited by CVD method thereon. Thereafter, a photoresist PR is coated on the insulating film layer IF, to form a pattern for the P-column injection to the photoresist PR by photolithography technique (photolithography).

Figure 20:
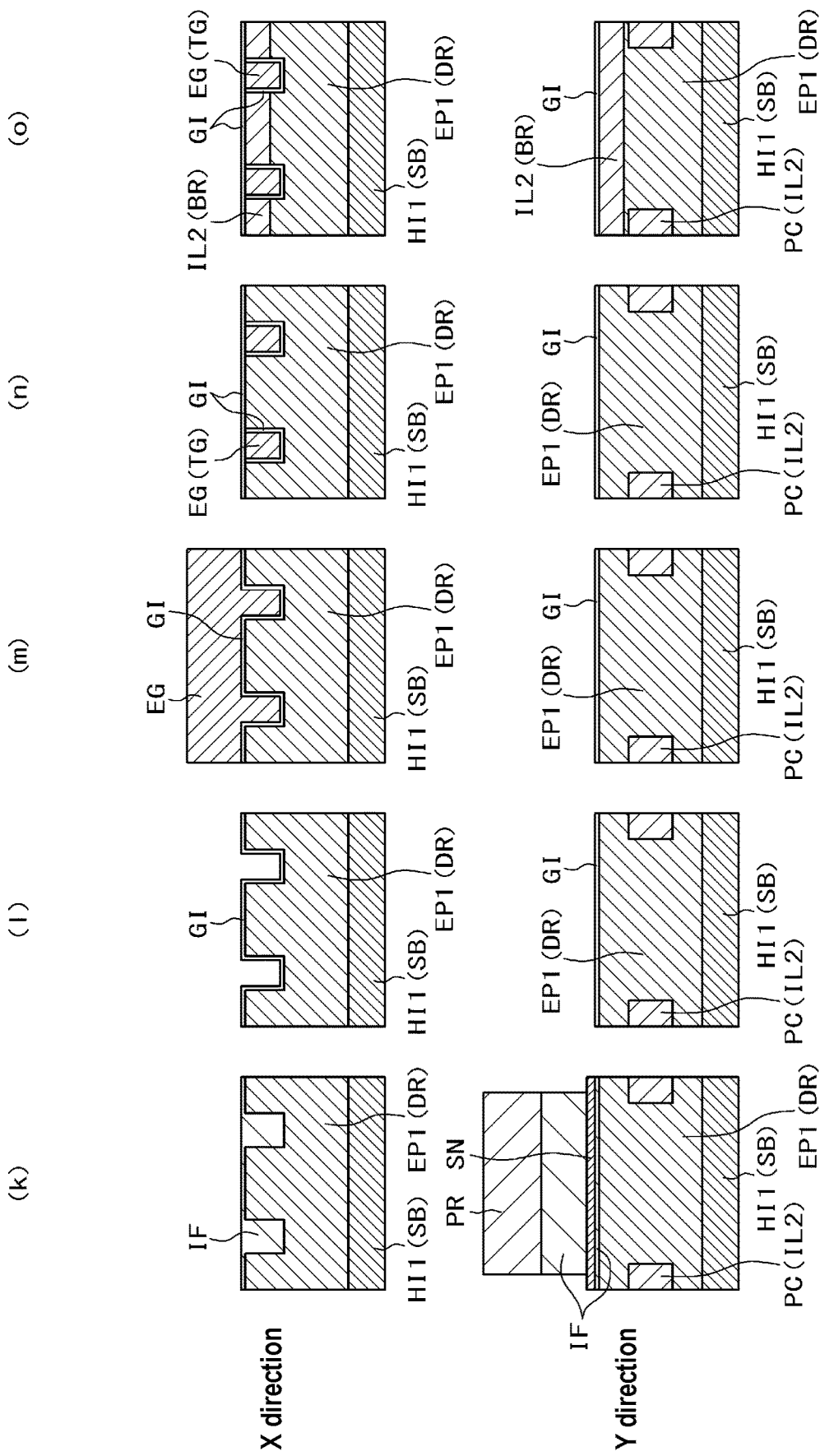
FIG. 20 is a cross-sectional view showing the manufacturing process of the semiconductor device following FIG. 19.

Next, in a step (j) and (k) of FIG. 20, the photoresist PR as a mask, dry etching is performed to form a pattern for P-column injection in the insulating film layer IF. At this time, the silicon nitride film (Si3N4 film) SN functions as an etching stopper layer. Thereafter, an ion implantation for P-column formation is performed using the photoresist PR and the patterned insulating film layer IF as a mask, the photoresist PR and the patterned insulating film layer IF, the silicon nitride film (Si3N4 film) SN, and the insulating film layer IF in the trench are removed by ashing, dry etching, and wet etching.

Next, in a step (1), the gate oxide film GI is formed on the first conductive type (n type) epitaxial layer EP1 including the trench by gate oxidation treatment. For this gate oxidation treatment, for example, pyrogenic oxidation by wet $O_2$, dry oxidation, oxidation in a chlorine atmosphere (HCl oxidation), or the like is used.

Next, in a step (m) and (n), a polysilicon film (Poly-Si film) is formed on the gate oxide film GI so as to embed the trench by CVD method, an embedded gate electrode EG to be the trench gate TG is formed by photolithography technique (photolithography) and dry etching.

Next, in a step (o), the second conductivity type (p-type) impurity layer IL2 which becomes the P-base region BR is formed by ion implantation.

Figure 21:
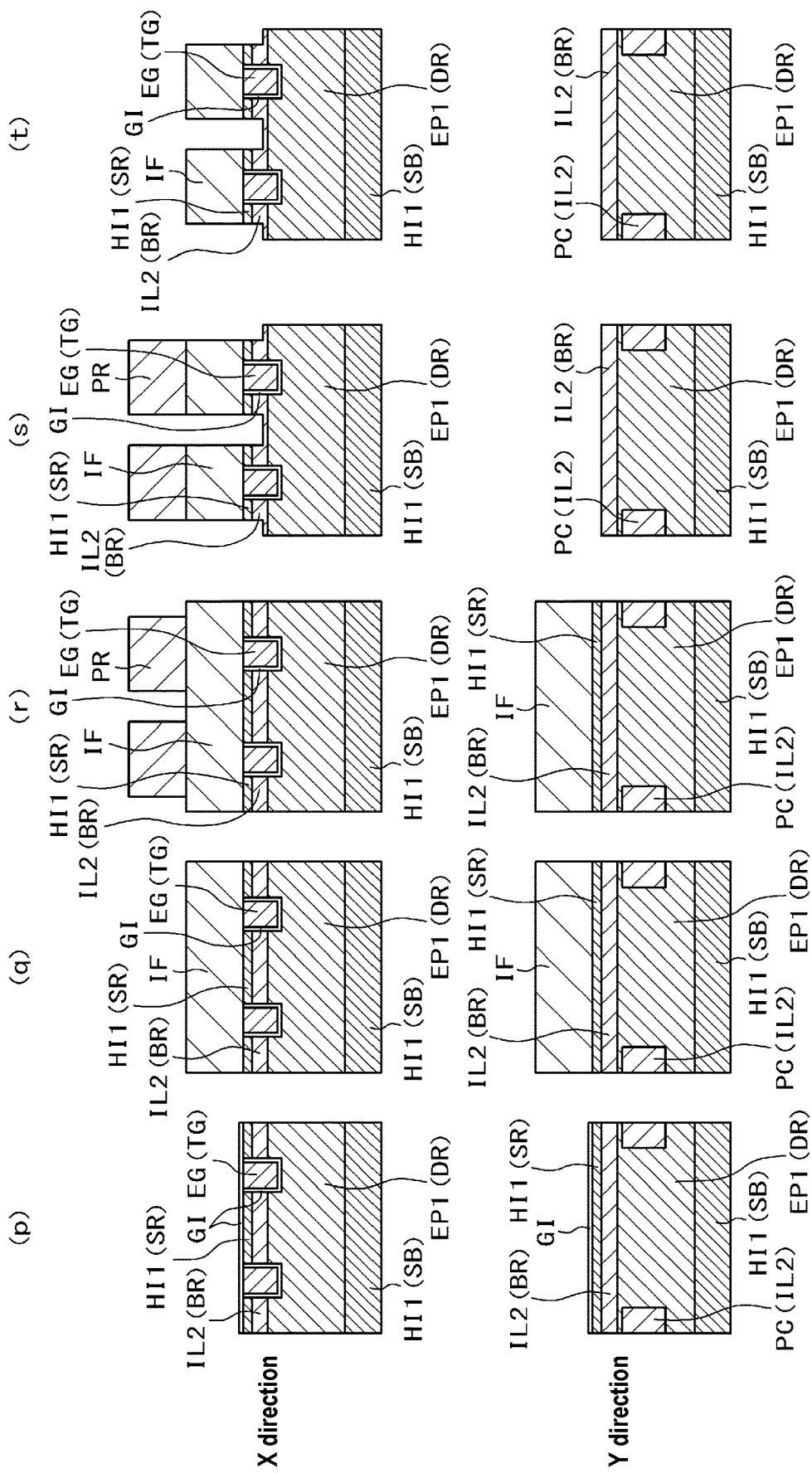
FIG. 21 is a cross-sectional view showing the manufacturing process of the semiconductor device following FIG. 20.

Next, in a step (p) of FIG. 21, by ion implantation, the first conductivity type (n-type) high-concentration impurity layer HI1 which becomes the n+ source region SR is formed in a region between the gate oxide film GI and the P-base region BR.

Next, in a step (q), an insulating film layer IF is formed by CVD method.

Next, in a step (r), a photoresist PR is coated on the insulating film layer IF, to form a contact hole pattern on the photoresist PR by photolithography technique (photolithography).

Next, in a step (s), dry etching is performed using the photoresist PR as a mask to form contact hole in the insulating film layer IF, n+ source region SR, and the P-base region BR. At this time, the contact hole is formed in a stripe shape between the two trench gates TG adjacent to each other. A bottom of the contact hole is formed deeper than the n+ source region SR and shallower than the interface between the P-base region BR and the drift region DR.

Next, in a step (t), the photoresist PR is removed by ashing.

Figure 22:
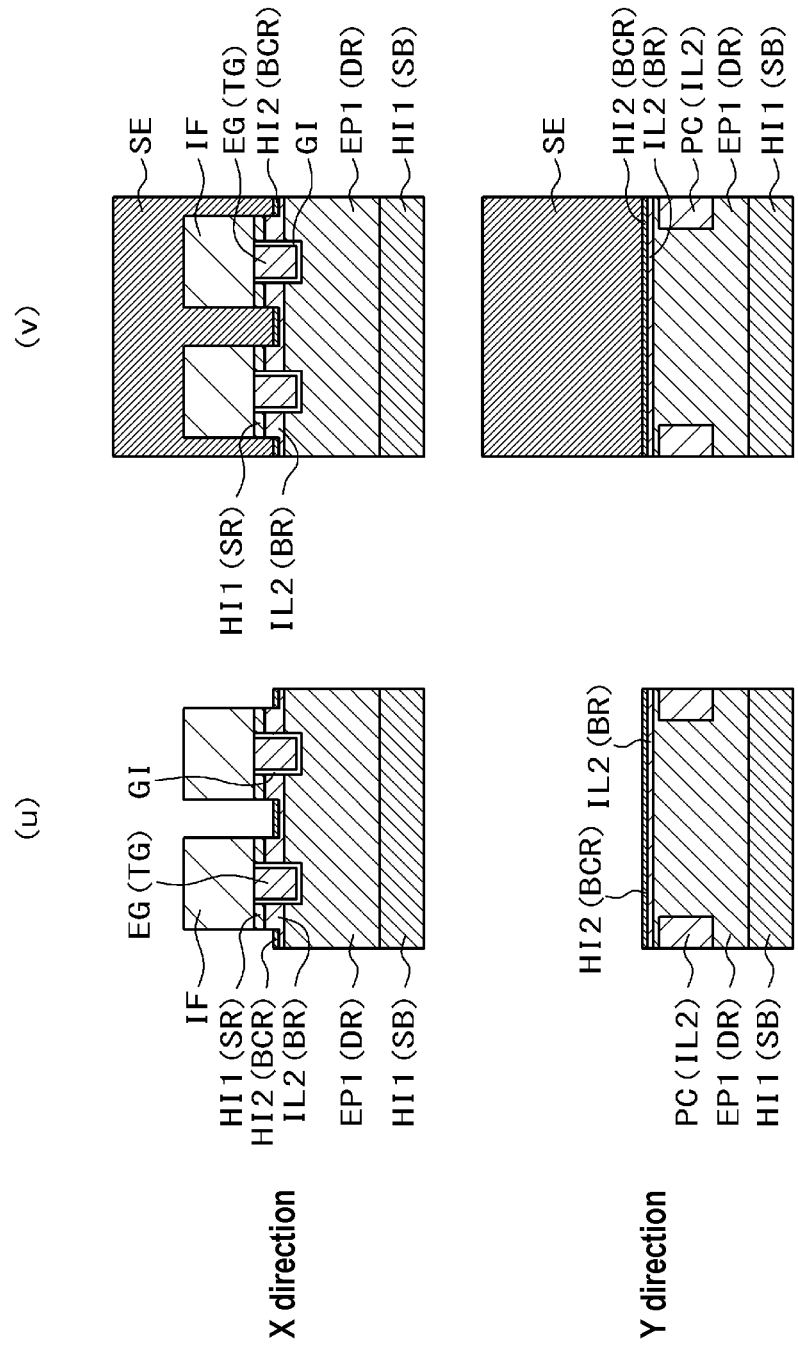
FIG. 22 is a cross-sectional view showing the manufacturing process of the semiconductor device following FIG. 21.

Next, in a step (u) of FIG. 22, the second conductivity type (p-type) high-concentration impurity layer H12 is formed at the bottom of the contact hole by ion implantation, which become as the base contact region BCR for lowering a contact resistance.

Finally, in a step (v), a poly-silicon film (Poly-Si film) to be as the n+ source electrode SE is formed so as to fill the contact hole. Thus, the semiconductor device shown in the first embodiment is manufactured.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a first epitaxial layer of a first conductivity type formed on an upper surface of a semiconductor substrate;
   a p-type column region of a second conductivity type formed on the first epitaxial layer, the second conductivity type being opposite the first conductivity type;
   a second epitaxial layer of the first conductivity type formed on the p-type column region;
   a first impurity layer of the second conductivity type formed on the second epitaxial layer;
   a second impurity layer of the first conductivity type formed on the first impurity layer;
   a trench penetrating through the second impurity layer and the first impurity layer such that a bottom portion of the trench is located in the second epitaxial layer; and
   a gate electrode embedded inside of the trench via a gate oxide film,
   wherein the gate electrode overlaps the bottom portion of the trench, the second epitaxial layer, the p-type column region, and the first epitaxial layer in plan view, and
   wherein, in plan view, a longitudinal direction of the p-type column region intersects a longitudinal direction of the gate electrode.

2. The semiconductor device according to claim 1, wherein, in plan view, the longitudinal direction of the p-type column region and the the longitudinal direction of the gate electrode are perpendicular to each other.

3. The semiconductor device according to claim 1, wherein a plurality of the gate electrodes is arranged at equal intervals, in plan view.

4. The semiconductor device according to claim 1, wherein a plurality of the p-type column regions is arranged at equal intervals, in plan view.

5. The semiconductor device according to claim 1,
   wherein the first impurity layer is a p-type base region, and
   wherein the p-type column region and the p-type base region are separated by the second epitaxial layer.

6. The semiconductor device according to claim 5, wherein a thickness of the second epitaxial layer is approximately 0.6 µm.

7. The semiconductor device according to claim 1, wherein the p-type column region has two impurity concentration peaks in a depth direction of the p-type column region.

8. The semiconductor device according to claim 7, wherein, of the two impurity concentration peaks, an impurity concentration of a shallow impurity concentration peak is higher than an impurity concentration of a deep impurity concentration peak.

9. The semiconductor device according to claim 8, wherein the impurity concentration of the shallow impurity concentration peak is approximately 20% higher than the impurity concentration of the deep impurity concentration peak.

* * * * *